(12) United States Patent
Govindaraj et al.

(10) Patent No.: US 9,784,777 B2
(45) Date of Patent: Oct. 10, 2017

(54) METHODS AND SYSTEMS FOR MEASURING POWER IN WIRELESS POWER SYSTEMS

(71) Applicant: QUALCOMM Incorporated, San Diego, CA (US)

(72) Inventors: Arvind Govindaraj, San Diego, CA (US); Joseph Najib Maalouf, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 596 days.

(21) Appl. No.: 14/495,458

(22) Filed: Sep. 24, 2014

(65) Prior Publication Data

US 2016/0084894 A1 Mar. 24, 2016

(51) Int. Cl.
*G01R 25/00* (2006.01)
*H04B 5/00* (2006.01)
(Continued)

(52) U.S. Cl.
CPC ............ *G01R 25/00* (2013.01); *G01R 25/04* (2013.01); *H02J 7/025* (2013.01); *H04B 5/0037* (2013.01);
(Continued)

(58) Field of Classification Search
CPC ...... G01R 25/00; G01R 25/005; G01R 25/04; G01R 19/00; G01R 19/0084; G01R 19/0092; G01N 29/075; H02J 50/80; H02J 7/00; H02J 7/02; H02J 7/022; H02J 7/025; H03K 2005/00286; G05B 1/00; G05B 1/01; G01P 3/565; H02H 3/00; H02H 3/26; H02H 3/28; H02H 3/30; H02H 3/302; H02H 3/32; H02H 3/34; H02H 3/353; H02H 3/38; H02H 3/382; H03D 1/2236;
(Continued)

(56) References Cited

U.S. PATENT DOCUMENTS 4,121,150 A * 10/1978 Kelley, Jr. ............. H02J 3/1864
323/210
5,570,086 A * 10/1996 Hanaoka ............... G06K 7/0008
340/10.51
(Continued)

*Primary Examiner* — Hoai-An D Nguyen
(74) *Attorney, Agent, or Firm* — Knobbe, Martens, Olson & Bear, LLP

(57) ABSTRACT

The invention provides a method and system for precisely measuring AC power and detecting load impedance using a precise analog front-end, zero-crossing detectors, and a phase detection system capable of extracting precise phase information from the sensed voltage and current measurements. More particularly, the invention provides an apparatus, comprising a transmit circuit configured to generate a wireless field via an antenna for transferring charging power to a receiver device, for determining a phase difference between a first signal and a second signal. The apparatus further comprises a phase detection circuit to output a phase signal indicating a duration of a phase offset between a time-varying voltage and a time-varying current of the transmit circuit. The apparatus further comprises a capacitor configured to receive a variable current from a current source for the duration of the phase offset between the time-varying voltage and a time-varying current.

20 Claims, 10 Drawing Sheets

(51) Int. Cl.
*G01R 25/04* (2006.01)
*H02J 7/02* (2016.01)
*H03K 5/00* (2006.01)
*H02J 50/80* (2016.01)

(52) U.S. Cl.
CPC ......... *H04B 5/0043* (2013.01); *G01R 25/005* (2013.01); *H02J 50/80* (2016.02); *H03K 2005/00286* (2013.01)

(58) Field of Classification Search
CPC ...... H03D 1/2254; H03D 1/2281; H04B 5/00; H04B 5/0037; H04B 5/0043
USPC .......... 324/76.11, 76.39, 76.52, 76.53, 76.77
See application file for complete search history.

(56) References Cited

U.S. PATENT DOCUMENTS

| | | | |
|---|---|---|---|
| 8,035,437 B2* | 10/2011 | Benyahia | H03K 5/156 327/231 |
| 8,729,735 B2 | 5/2014 | Urano | |
| 9,041,371 B2* | 5/2015 | Gotoh | H02M 1/32 323/282 |
| 2005/0134322 A1* | 6/2005 | Kang | H03D 13/003 327/2 |
| 2009/0224805 A1* | 9/2009 | Bore | H03F 3/456 327/65 |
| 2010/0073977 A1* | 3/2010 | Nakamoto | H02M 1/4208 363/126 |
| 2011/0049997 A1 | 3/2011 | Urano | |
| 2011/0050166 A1* | 3/2011 | Cook | H02J 17/00 320/108 |
| 2011/0101791 A1 | 5/2011 | Urano | |
| 2012/0126636 A1 | 5/2012 | Atsumi | |
| 2014/0111154 A1 | 4/2014 | Roy et al. | |
| 2014/0266018 A1* | 9/2014 | Carobolante | H02J 7/025 320/108 |
| 2015/0333797 A1* | 11/2015 | Nejatali | H04B 5/0043 375/376 |

* cited by examiner

US 9,784,777 B2

METHODS AND SYSTEMS FOR MEASURING POWER IN WIRELESS POWER SYSTEMS

TECHNICAL FIELD

The described technology generally relates to wireless power transfer. More specifically, the disclosure is directed to devices, systems, and methods related to power and impedance measurement in a wireless power charging system.

BACKGROUND

In wireless power applications, alternating current (AC) power measurement systems may provide foreign object detection, load power management control measures, and efficiency regulated control loops. Such AC power measurement systems may comprise load impedance measurements, which may provide load detection as well as dynamic tuning, foreign object detection, etc. Measuring power and impedance at high frequencies and over a large load impedance range is challenging. Thus, there is a need for a system and method for obtaining precise and accurate measurements of AC power and load impedance using cost-efficient components.

SUMMARY

The systems, methods, and devices of the invention each have several aspects, no single one of which is solely responsible for its desirable attributes. Without limiting the scope of this invention as expressed by the claims which follow, some features will now be discussed briefly. After considering this discussion, and particularly after reading the section entitled "Detailed Description," one will understand how the features of the various embodiments of this invention provide advantages that include improved power and impedance measurements in wireless power systems.

A One aspect of the invention provides an apparatus for determining a phase difference between a time-varying voltage and a time-varying current. The apparatus comprises a transmit circuit including an antenna. The transmit circuit may be configured to generate a wireless field via the antenna for transferring charging power to a receiver device. The wireless field may be based on the time-varying voltage and the time-varying current. The apparatus further comprises a phase detection circuit configured to output a phase signal indicating a duration of a phase offset between the time-varying voltage and a time-varying current. The apparatus further comprises a capacitor configured to receive a current from a current source for the duration of the phase offset between the time-varying voltage and a time-varying current. The apparatus further comprises at least one switch operably coupled to the capacitor and configured to selectively couple the current from the current source to the capacitor in response to the phase signal, the phase signal allows activation of the at least one switch.

Another aspect of the invention provides a method for determining a phase difference between a first signal and a second signal. The method comprises generating a phase signal indicating a duration of a phase offset between the first and second signals. The method further comprises receiving a current from a current source for the duration of the phase offset between the first and second signals. The method further comprises selectively coupling the current from the current source to the capacitor in response to the phase signal. The phase signal allowing activation of at least one switch.

Another aspect of the invention provides an apparatus for determining a phase difference between a first signal and a second signal. The apparatus comprises means for generating a phase signal indicating a duration of a phase offset between the first and second signals. The apparatus further comprises means for receiving a current from a current source for the duration of the phase offset between the first and second signals. The apparatus further comprises at least one means for selectively coupling the current from the current source to the means for receiving a current in response to a phase signal. The phase signal allowing activation of the at least one means for selectively coupling.

BRIEF DESCRIPTION OF THE DRAWINGS

The above-mentioned aspects, as well as other features, aspects, and advantages of the present technology will now be described in connection with various embodiments, with reference to the accompanying drawings. The illustrated embodiments, however, are merely examples and are not intended to be limiting. Throughout the drawings, similar symbols typically identify similar components, unless context dictates otherwise. Note that the relative dimensions of the following figures may not be drawn to scale.

DETAILED DESCRIPTION

In the following detailed description, reference is made to the accompanying drawings, which form a part of the present disclosure. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and form part of this disclosure.

Wireless power transfer may refer to transferring any form of energy associated with electric fields, magnetic fields, electromagnetic fields, or otherwise from a transmitter to a receiver without the use of physical electrical conductors (e.g., power may be transferred through free space). Power output into a wireless field (e.g., a magnetic field or an electromagnetic field) may be received, captured by, or coupled by a "receive antenna" to achieve power transfer.

The terminology used herein is for the purpose of describing particular embodiments only and is not intended to be limiting of the disclosure. It will be understood by those within the art that if a specific number of a claim element is intended, such intent will be explicitly recited in the claim, and in the absence of such recitation, no such intent is present. For example, as used herein, the singular forms "a", "an" and "the" are intended to include the plural forms as well, unless the context clearly indicates otherwise. As used herein, the term "and/or" includes any and all combinations of one or more of the associated listed items. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Figure 1:
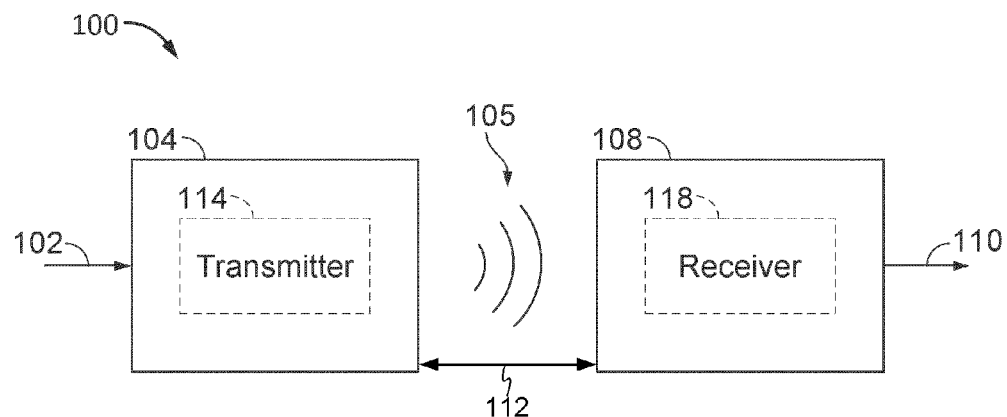
FIG. 1 is a functional block diagram of a wireless power transfer system, in accordance with one exemplary implementation.

FIG. 1 is a functional block diagram of a wireless power transfer system 100, in accordance with one exemplary implementation. As shown in FIG., an input power 102 may be provided to a transmitter 104 from a power source (not shown in this figure) to generate a wireless (e.g., magnetic or electromagnetic) field 105 for performing energy transfer. A receiver 108 may couple to the wireless field 105 and generate an output power 110 for storing or consumption by a device (not shown in this figure) coupled to the output power 110. Both the transmitter 104 and the receiver 108 are separated by a distance 112.

In one exemplary implementation, the transmitter 104 and the receiver 108 are configured according to a mutual resonant relationship. When a resonant frequency of the receiver 108 and a resonant frequency of the transmitter 104 are substantially the same or very close, transmission losses between the transmitter 104 and the receiver 108 are minimal. As such, wireless power transfer may be provided over a larger distance in contrast to purely inductive solutions that may require large antenna coils which are very close (e.g., sometimes within millimeters). Resonant inductive coupling techniques may thus allow for improved efficiency and power transfer over various distances and with a variety of inductive coil configurations.

The receiver 108 may receive power when the receiver 108 is located in the wireless field 105 produced by the transmitter 104. The wireless field 105 corresponds to a region where energy output by the transmitter 104 may be captured by the receiver 108. The wireless field 105 may correspond to the "near-field" of the transmitter 104 as will be further described below. The transmitter 104 may include a transmit antenna or coil 114 for transmitting energy to the receiver 108. The receiver 108 may include a receive antenna or coil 118 for receiving or capturing energy transmitted from the transmitter 104. The near-field may correspond to a region in which there are strong reactive fields resulting from the currents and charges in the transmit coil 114 that minimally radiate power away from the transmit coil 114. The near-field may correspond to the region that is within about one wavelength (or a fraction thereof) of the transmit coil 114.

As described above, efficient energy transfer may occur by coupling a large portion of the energy in the wireless field 105 to the receive coil 118 rather than propagating most of the energy in an electromagnetic wave to the far field. When positioned within the wireless field 105, a "coupling mode" may be developed between the transmit coil 114 and the receive coil 118. An area around the transmit coil 114 and the receive coil 118 where this coupling may occur is referred to herein as a coupling-mode region.

Figure 2:
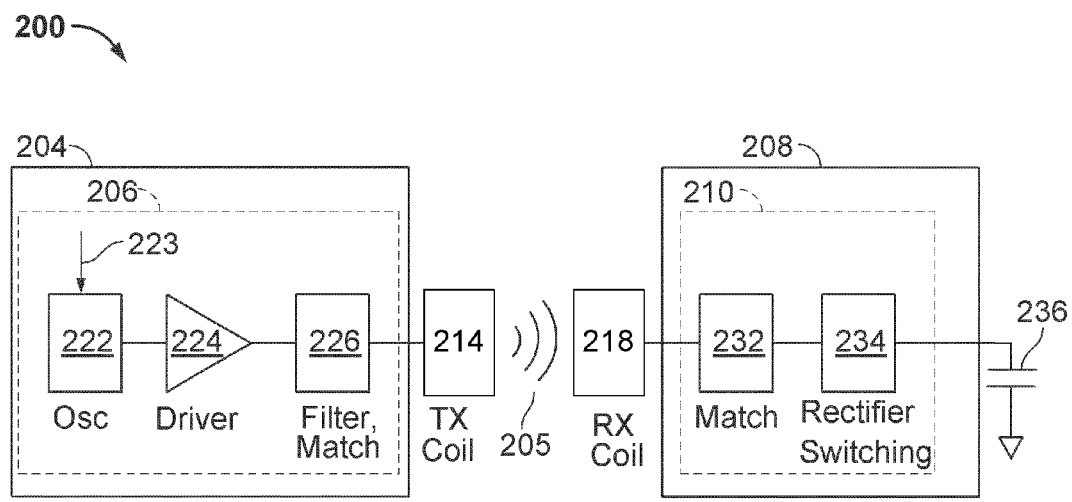
FIG. 2 is a functional block diagram of a wireless power transfer system, in accordance with another exemplary implementation.

FIG. 2 is a functional block diagram of a wireless power transfer system 200, in accordance with another exemplary implementation. As shown in FIG. 2, the system 200 includes a transmitter 204 and a receiver 208. The transmitter 204 may include a transmit circuitry 206 that may include an oscillator 222, a driver circuit 224, and a filter and matching circuit 226. The oscillator 222 may be configured to generate a signal at a desired frequency that may be adjusted in response to a frequency control signal 223. The oscillator 222 may provide the oscillator signal to the driver circuit 224. The driver circuit 224 may be configured to drive the transmit antenna or coil 214 at, for example, a resonant frequency of the transmit coil 214 based on an input voltage signal (VD) 225. The driver circuit 224 may be a switching amplifier configured to receive a square wave from the oscillator 222 and output a sine wave.

The filter and matching circuit 226 may filter out harmonics or other unwanted frequencies and match the impedance of the transmitter 204 to the transmit coil 214. As a result of driving the transmit coil 214, the transmit coil 214 may generate a wireless field 205 to wirelessly output power at a level sufficient for charging a battery 236.

The receiver 208 may include a receive circuitry 210 that may include a matching circuit 232 and a rectifier circuit 234. The matching circuit 232 may match the impedance of the receive circuitry 210 to the receive antenna or coil 218. The rectifier circuit 234 may generate a direct current (DC) power output from an alternate current (AC) power input to charge the battery 236, as shown in FIG. 2. The receiver 208 and the transmitter 204 may additionally communicate on a separate communication channel 219 (e.g., Bluetooth, Zigbee, cellular, etc.). The receiver 208 and the transmitter 204 may alternatively communicate via in-band signaling using characteristics of the wireless field 205.

The receiver 208 may be configured to determine whether an amount of power transmitted by the transmitter 204 and received by the receiver 208 is appropriate for charging the battery 236.

Figure 3:
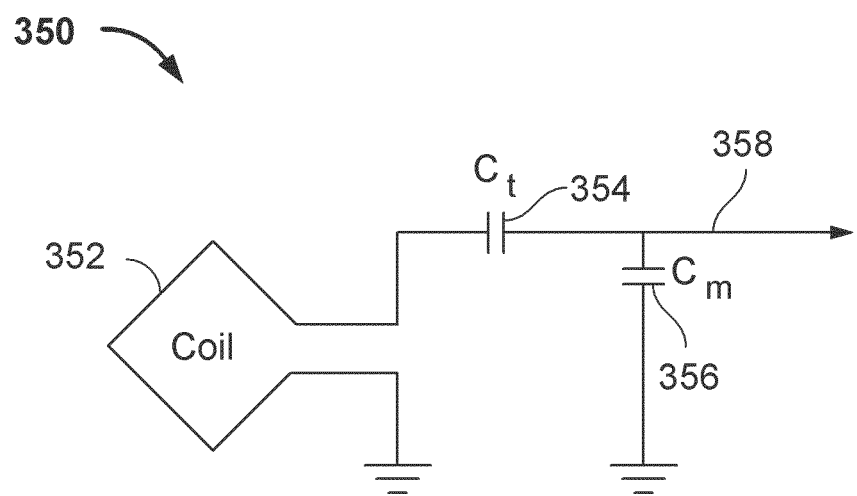
FIG. 3 is a schematic diagram of a portion of transmit circuitry or receive circuitry of FIG. 2 including a transmit or receive antenna, in accordance with exemplary implementations.

FIG. 3 is a schematic diagram of a portion of the transmit circuitry 206 or the receive circuitry 210 of FIG. 2, in accordance with exemplary implementations. As illustrated in FIG. 3, a transmit or receive circuitry 350 may include an antenna 352. The antenna 352 may also be referred to or be configured as a "loop" antenna 352. The antenna 352 may also be referred to herein or be configured as a "magnetic" antenna or an induction coil. The term "antenna" generally refers to a component that may wirelessly output or receive energy for coupling to another "antenna." The antenna may also be referred to as a coil of a type that is configured to wirelessly output or receive power. As used herein, the antenna 352 is an example of a "power transfer component" of a type that is configured to wirelessly output and/or receive power.

The antenna 352 may include an air core or a physical core such as a ferrite core (not shown in this figure). Air core loop antennas may be more tolerant to extraneous physical devices placed in the vicinity of the core. Furthermore, the air core loop antenna 352 allows the placement of other components within the core area. In addition, the air core loop may more readily enable placement of the receive coil 218 (FIG. 2) within a plane of the transmit coil 214 (FIG. 2) where the coupled-mode region of the transmit coil 214 may be more powerful.

As stated, efficient transfer of energy between the transmitter 104 (transmitter 204 as referenced in FIG. 2) and the receiver 108 (receiver 208 as referenced in FIG. 2) may occur during matched or nearly matched resonance between the transmitter 104 and the receiver 108. However, even when resonance between the transmitter 104 and receiver 108 are not matched, energy may be transferred, although the efficiency may be affected. For example, the efficiency may be less when resonance is not matched. Transfer of energy occurs by coupling energy from the wireless field 105 (wireless field 205 as referenced in FIG. 2) of the transmit coil 114 (transmit coil 214 as referenced in FIG. 2) to the receive coil 118 (receive coil 218 as referenced in FIG. 2), residing in the vicinity of the wireless field 105, rather than propagating the energy from the transmit coil 114 into free space.

The resonant frequency of the loop or magnetic antennas is based on the inductance and capacitance. Inductance may be simply the inductance created by the antenna 352, whereas, capacitance may be added to the antenna's inductance to create a resonant structure at a desired resonant frequency. As a non-limiting example, a capacitor 354 and a capacitor 356 may be added to the transmit or receive circuitry 350 to create a resonant circuit that selects a signal 358 at a resonant frequency. Accordingly, for larger diameter antennas, the size of capacitance needed to sustain resonance may decrease as the diameter or inductance of the loop increases.

Furthermore, as the diameter of the antenna increases, the efficient energy transfer area of the near-field may increase. Other resonant circuits formed using other components are also possible. As another non-limiting example, a capacitor may be placed in parallel between the two terminals of the circuitry 350. For transmit antennas, the signal 358, with a frequency that substantially corresponds to the resonant frequency of the antenna 352, may be an input to the antenna 352.

Referencing FIG. 1, the transmitter 104 may output a time varying magnetic (or electromagnetic) field with a frequency corresponding to the resonant frequency of the transmit coil 114. When the receiver 108 is within the wireless field 105, the time varying magnetic (or electromagnetic) field may induce a current in the receive coil 118. As described above, if the receive coil 118 is configured to resonate at the frequency of the transmit coil 114, energy may be efficiently transferred. The AC signal induced in the receive coil 118 may be rectified as described above to produce a DC signal that may be provided to charge or to power a load.

Figure 4:
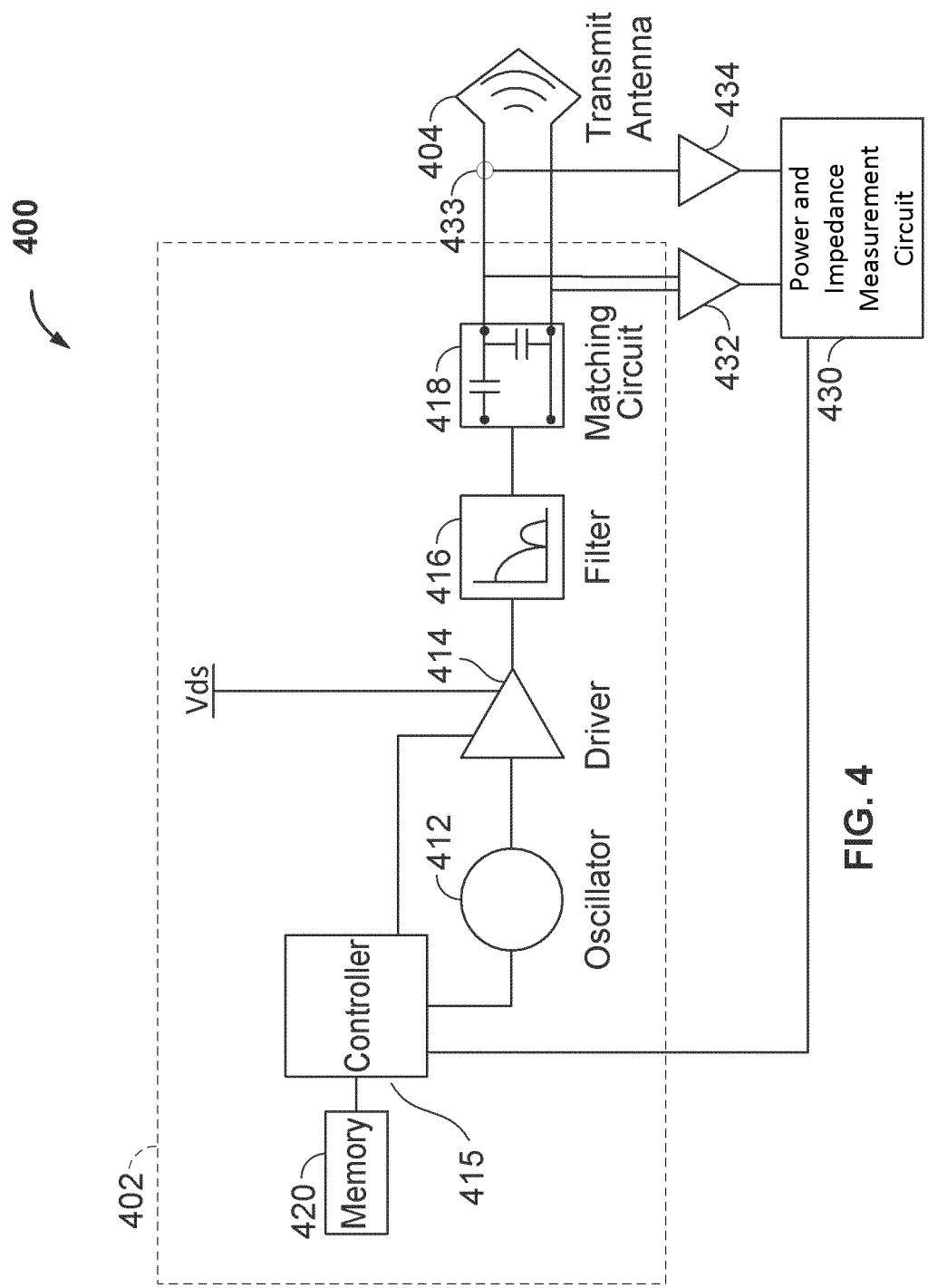
FIG. 4 is a simplified functional block diagram of a transmitter that may be used in an inductive power transfer system, in accordance with exemplary embodiments of the invention.

FIG. 4 is a simplified functional block diagram of a transmitter that may be used in an inductive power transfer system, in accordance with exemplary embodiments of the invention. As shown in FIG. 4, the transmitter 400 includes transmit circuitry 402 and a transmit antenna 404 operably coupled to the transmit circuitry 402. The transmit antenna 404 may be configured as the transmit coil 214 as described above in reference to FIG. 2. In some embodiments, the transmit antenna 404 may be a coil (e.g., an induction coil). In other embodiments the transmit antenna 404 may be an RF antenna. In some embodiments, the transmit antenna 404 may be associated with a larger structure, such as a table, mat, lamp, or other stationary configuration. The transmit antenna 404 may be configured to generate an electromagnetic or magnetic field, hereinafter referred to as a "charging region," as described above. In an exemplary embodiment, the transmit antenna 404 may be configured to transmit power to a receiver device within the charging region at a power level sufficient to charge or power the receiver device.

The transmit circuitry 402 may receive power through a number of power sources (not shown). The transmit circuitry 402 may include various components configured to drive the transmit antenna 404. In some exemplary embodiments, the transmit circuitry 402 may be configured to adjust the transmission of wireless power based on the presence and constitution of the receiver devices as described herein. As such, the transmitter 400 may provide wireless power efficiently and safely.

The transmit circuitry 402 may further include a controller 415. In some embodiments, the controller 415 may be a micro-controller. In other embodiments, the controller 415 may be implemented as an application-specific integrated circuit (ASIC). The controller 415 may be operably connected, directly or indirectly, to each component of the transmit circuitry 402. The controller 415 may be further configured to receive information from each of the components of the transmit circuitry 402 and perform calculations based on the received information. The controller 415 may be configured to generate control signals for each of the components that may adjust the operation of that component. As such, the controller 415 may be configured to adjust the power transfer based on a result of the calculations performed by it.

The transmit circuitry 402 may further include a memory 420 operably connected to the controller 415. The memory 420 may comprise random-access memory (RAM), electrically erasable programmable read only memory (EEPROM), flash memory, or non-volatile RAM. The memory 420 may be configured to temporarily or permanently store data for use in read and write operations performed by the controller 415. For example, the memory 420 may be configured to store data generated as a result of the calculations of the controller 415. As such, the memory 420 allows the controller 415 to adjust the transmit circuitry 402 based on changes in the data over time.

The transmit circuitry 402 may further include an oscillator 412 operably connected to the controller 415. The oscillator 412 may be configured as the oscillator 222 as described above in reference to FIG. 2. The oscillator 412 may be configured to generate an oscillating signal (e.g., radio frequency (RF) signal) at the operating frequency of the wireless power transfer. In some exemplary embodiments, the oscillator 412 may be configured to operate at the 6.78 MHz ISM frequency band. The controller 415 may be configured to selectively enable the oscillator 412 during a transmit phase (or duty cycle). The controller 415 may be further configured to adjust the frequency or a phase of the oscillator 412 which may reduce out-of-band emissions, especially when transitioning from one frequency to another. As described above, the transmit circuitry 402 may be configured to provide an amount of RF power to the transmit antenna 404 via the RF signal, which may generate energy (e.g., magnetic flux) about the transmit antenna 404.

The transmit circuitry 402 may further include a driver circuit 414 operably connected to the controller 415 and the oscillator 412. The driver circuit 414 may be configured as the driver circuit 224 as described above in reference to FIG. 2. The driver circuit 414 may be configured to drive the RF signals received from the oscillator 412, as described above.

The transmit circuitry 402 may further include a low pass filter (LPF) 416 operably connected to the transmit antenna 404. The low pass filter 416 may be configured as the filter portion of the filter and matching circuit 226 as described above in reference to FIG. 2. In some exemplary embodiments, the low pass filter 416 may be configured to receive and filter an analog signal of current and an analog signal of voltage generated by the driver circuit 414. The analog signal of current may comprise a time-varying current signal, while the analog signal of current may comprise a time-varying voltage signal. In some embodiments, the low pass filter 416 may alter a phase of the analog signals. The low pass filter 416 may cause the same amount of phase change for both the current and the voltage, canceling out the changes. In some embodiments, the controller 415 may be configured to compensate for the phase change caused by the low pass filter 416. The low pass filter 416 may be configured to reduce harmonic emissions to levels that may prevent self-jamming. Other exemplary embodiments may include different filter topologies, such as notch filters that attenuate specific frequencies while passing others.

The transmit circuitry 402 may further include a fixed impedance matching circuit 418 operably connected to the low pass filter 416 and the transmit antenna 404. The matching circuit 418 may be configured as the matching portion of the filter and matching circuit 226 as described above in reference to FIG. 2. The matching circuit 418 may be configured to match the impedance of the transmit circuitry 402 (e.g., 50 ohms) to the transmit antenna 404. Other exemplary embodiments may include an adaptive impedance match that may be varied based on measurable transmit metrics, such as the measured output power to the transmit antenna 404 or a DC current of the driver circuit 414. The transmit circuitry 402 may further comprise discrete devices, discrete circuits, and/or an integrated assembly of components.

Transmit antenna 404 may be implemented as an antenna strip with the thickness, width and metal type selected to keep resistive losses low. In a conventional implementation, the transmit antenna 404 can generally be configured for association with a larger structure such as a table, mat, lamp or other less portable configuration. Accordingly, the transmit antenna 404 generally will not need "turns" in order to be of a practical dimension. An exemplary implementation of a transmit antenna 404 may be "electrically small" (i.e., fraction of the wavelength) and tuned to resonate at lower usable frequencies by using capacitors to define the resonant frequency. In an exemplary application where the transmit antenna 404 may be larger in diameter, or length of side if a square loop, (e.g., 0.50 meters) relative to the receive antenna, the transmit antenna 404 will not necessarily need a large number of turns to obtain a reasonable capacitance.

Additionally, FIG. 4 depicts a voltage sensor 432 and a current sensor 434 that may be operably coupled to an impedance measurement circuit 430. The voltage sensor 432 is depicted operably coupled to the matching circuit 418, while current sensor 434 is depicted operably coupled to the transmitter 400 between the matching circuit 418 and the transmit antenna 404 at sensor agnostic point 433. An impedance measurement circuit 430 is depicted as being operably coupled to the controller 415. The voltage sensor 432 may be operably coupled at various points of the matching circuit 418 or of the transmit circuit 402 itself and need not be coupled exclusively at the matching circuit 418. Similarly, the current sensor 434 may not be coupled at the point 433 indicated in FIG. 4. The voltage and current sensors 432 and 434, respectively, may be operably connected at any position where a sensed voltage and current may provide a sensed power or impedance presented to the transmit antenna 404, for example before the matching circuit 418 or at the antenna 404. Point 433 identifies a current sensor agnostic, which represents a point at which the current may be sensed by a current sensor 434. In some embodiments, the voltage and current sensors 432 and 434 may be configured to sense a time-varying voltage signal and a time-varying current signal, respectively.

The voltage sensor 432 may be configured to perform the voltage sensing and may be configured to output the sensed voltage to an input of the impedance measurement circuit 430. The voltage sensor 432 may be configured to sense the difference in the voltage of the two points at which the voltage sensor 432 is connected. For example, outputs of the matching circuit 418 may feed to the inputs of the voltage sensor 432. In some embodiments, the voltage sensor 432 may comprise a voltage divider network. In some embodiments, alternative methods and systems of voltage sensing may be utilized for the AC power and load impedance measurement.

Similarly, the current sensor 434 may be configured to perform the current sensing and may be configured to output the sensed current to another input of the impedance measurement circuit 430. The current sensor 434 may be configured to sense the current flowing between the points at which the current sensor 434 is connected. For example, an output of the matching circuit 418 may feed to the inputs of the current sensor 434. In some embodiments, the current sensor 434 may comprise a current sensing coil (not shown in this figure) fabricated on a printed circuit board (PCB) (not shown in this figure), wherein the current may be routed to an inner PCB and a coil is built around it using the top and/or bottom planes of the PCB. In some embodiments, alternative methods and systems of current sensing may be utilized for the AC power and load impedance measurement.

The impedance measurement circuit 430 may be the circuit that may be configured to perform the AC power and load impedance measurements that may be used in foreign object detection, load power management or control, load detection, or dynamic tuning, among others uses. The impedance measurement circuit 430 will be described in further detail below with reference to FIG. 6. In some embodiments, the impedance measurement circuit 430 may be configured to couple with at least one of the controller 415, the oscillator 412, and/or the driver 414. In some embodiments, the impedance measurement circuit 430 may provide a signal to at least one of the above listed components to adjust the output power (e.g., the current or the voltage) output by the transmitter 400.

Figure 5:
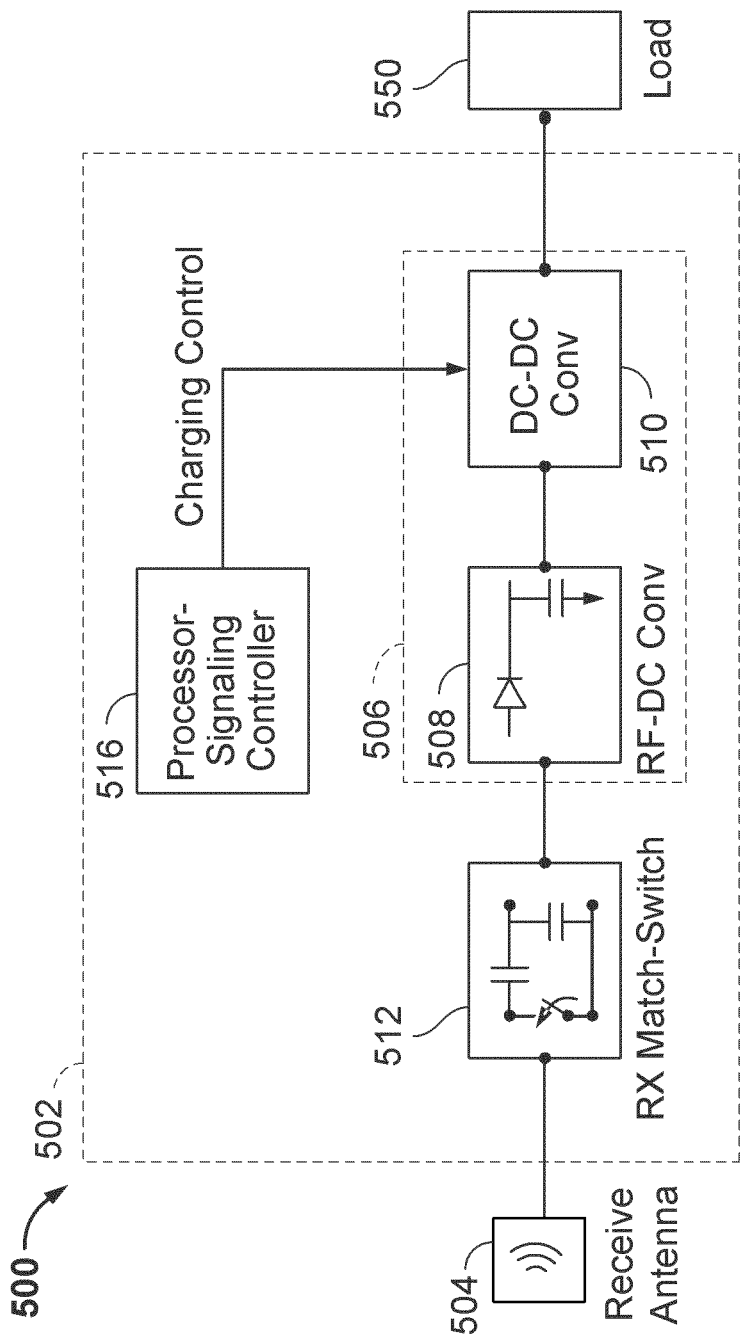
FIG. 5 is a simplified functional block diagram of a receiver that may be used in the inductive power transfer system, in accordance with exemplary embodiments of the invention.

FIG. 5 is a block diagram of a receiver, in accordance with an embodiment of the present invention. As shown in FIG. 5, a receiver 500 includes a receive circuitry 502, a receive antenna 504, and a load 550. The receiver 500 further couples to the load 550 for providing received power thereto. Receiver 500 is illustrated as being external to device acting as the load 550 but may be integrated into load 550. The receive antenna 504 may be operably connected to the receive circuitry 502. The receive antenna 504 may be configured as the receive coil 218 as described above in reference to FIG. 2. In some embodiments, the receive antenna 504 may be tuned to resonate at a frequency similar to a resonant frequency of the transmit antenna 404, or within a specified range of frequencies, as described above. The receive antenna 504 may be similarly dimensioned with transmit antenna 404 or may be differently sized based upon the dimensions of the load 550. The receive antenna 504 may be configured to couple to the magnetic field generated by the transmit antenna 404, as described above, and provide an amount of received energy to the receive circuitry 502 to power or charge the load 550.

The receive circuitry 502 may be operably coupled to the receive antenna 504 and the load 550. The receive circuitry may be configured as the receive circuitry 210 as described above in reference to FIG. 2. The receive circuitry 502 may be configured to match an impedance of the receive antenna 504, which may provide efficient reception of wireless power. The receive circuitry 502 may be configured to generate power based on the energy received from the receive antenna 504. The receive circuitry 502 may be configured to provide the generated power to the load 550. In some embodiments, the receiver 500 may be configured to transmit a signal to the transmitter 400 indicating an amount of power received from the transmitter 400.

The receive circuitry 502 may include a processor-signaling controller 516 configured to coordinate the processes of the receiver 500 described below. The receive circuitry 502 may be configured to provide an impedance match to the receive antenna 504 to improve power transfer efficiency.

The receive circuitry 502 provides an impedance match to the receive antenna 504. The receive circuitry 502 includes power conversion circuitry 506 for converting a received RF energy source into charging power for use by the load 550. The power conversion circuitry 506 includes an RF-to-DC converter 508 coupled to a DC-to-DC converter 510. The RF-to-DC converter 508 rectifies the RF energy signal received at the receive antenna 504 into a non-alternating power while the DC-to-DC converter 510 converts the rectified RF energy signal into an energy potential (e.g., voltage) that is compatible with the load 550. Various RF-to-DC converters are contemplated including partial and full rectifiers, regulators, bridges, doublers, as well as linear and switching converters.

The receive circuitry 502 may further include switching circuitry 512 configured to connect the receive antenna 504 to the power conversion circuitry 506 or alternatively for disconnecting the power conversion circuitry 506 from the receive antenna 504. Disconnecting the receive antenna 504 from the power conversion circuitry 506 not only suspends charging of the load 550, but also changes the "load" as "seen" by the transmitter 400 (FIG. 4) as is explained more fully below.

The load 550 may be operably connected to the receive circuitry 502. The load may be configured as the battery 236 as described above in reference to FIG. 2. In some embodiments the load 550 may be external to the receive circuitry 502. In other embodiments the load 550 may be integrated into the receive circuitry 502.

In some embodiments of the transmitter 400 as referenced in FIG. 4, a power measurement and load impedance detection system may utilize a quadrature clock, mixers, and other signal processing elements to calculate voltage and current vectors. Other power measurement embodiments may utilize direct root-mean square (RMS) power detectors, which may introduce additional constraints (e.g., stable load impedance). Wireless power systems may include a power transfer unit (e.g., a charging device) and one or more power receive units (e.g., a cellphone, a laptop, etc.) to be charged. Non-compliant objects may be present within the charging region of the power transfer unit, and dynamic load fluctuations may occur. However, some embodiments may not be suited to determine dynamic load fluctuations because they measure power at an insufficient rate. Accordingly, there is a need for improved systems and methods for measuring power and impedance in wireless power charging systems.

Figure 6:
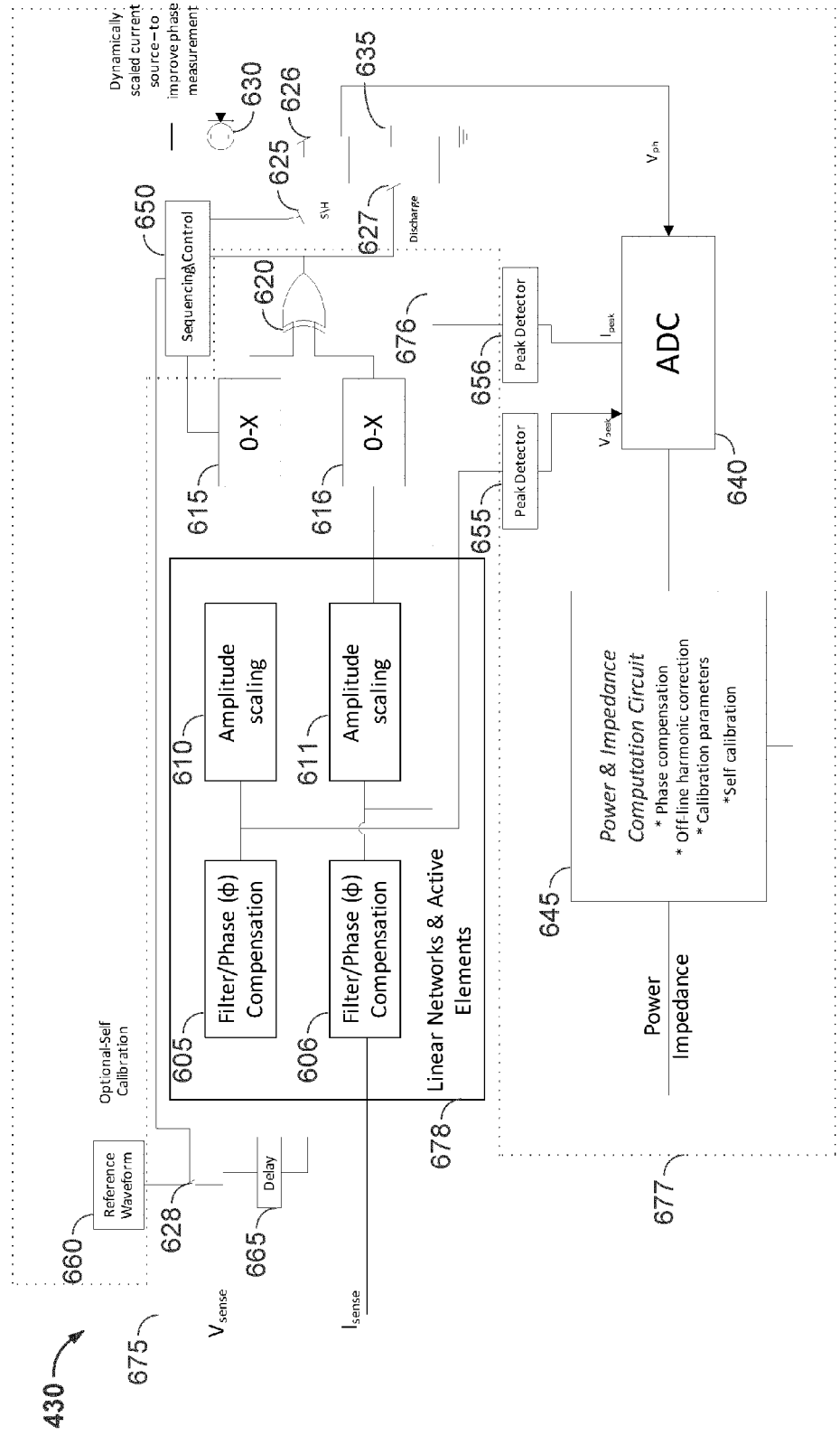
FIG. 6 illustrates a schematic diagram of an exemplary circuit implementing the transmitter of FIG. 4, in accordance with exemplary embodiments of the invention.

FIG. 6 illustrates a schematic diagram of an exemplary power and impedance circuit implemented in the transmitter 400 of FIG. 4, in accordance with exemplary embodiments of the invention. As noted above, the power and impedance measurement circuit 430 of FIG. 4 may comprise multiple components and modules that may be used in determining the power and impedance of an AC device. As shown in FIG. 6, the power and impedance measurement circuit 430 may be divided into three portions, including an analog-front-end ("AFE") 675, a zero-crossing and phase detection circuit 676, and a power and impedance measurement system 677. Each of these circuits and systems may be configured to interact with and manipulate analog voltage and current signals input into and through the AFE 675. As represented in FIG. 4, the power and impedance circuit may be part of a transmit circuit comprising an antenna, the transmit circuit configured to generate a wireless field via the antenna for transferring charging power to a receiver device, the transmit circuit having a time-varying voltage and a time-varying current.

The AFE 675 may comprise a voltage sensor 432 and a current sensor 434 (not shown in this figure) and the linear networks and active elements 678 (comprising a pair of filter/phase compensation circuits, including a voltage filter/phase compensation circuit 605 and a current filter/phase compensation circuit 606) and a pair of amplitude scaling circuits (a voltage amplitude scaling circuit 610 and a current amplitude scaling circuit 611)). The zero-crossing and phase detection circuit 676 may comprise a voltage zero-crossing detector 615 and a current zero-crossing detector 616 and an XOR gate 620. The power and impedance measurement system 677 may comprise a sequence controller 650, a plurality of switches 625, 626, and 627, a dynamically scaled (i.e., variable) current source 630, a capacitor 635, a voltage peak detector 655 and a current peak detector 656, an analog/digital (A/D) converter 640, and a power and impedance computation circuit 645 (or other structure) that may perform an algorithm (not shown in this figure), for example controller 415 or any other controller or processor or similar circuitry.

As discussed in reference with FIG. 4, the power and impedance measurement circuit 430 may be coupled to the voltage sensor 432 and the current sensor 434. As shown in FIG. 6, the outputs of the voltage sensor 432 and the current sensor 434 are the sensed voltage $V_{sense}$ and the sensed current $I_{sense}$. As discussed above, alternative methods and systems for sensing the voltage and the current may be utilized by the power and impedance circuit (or module) 430. Both of the sensed voltage and the sensed current may be coupled to the respective filter/phase compensation circuits 605 and 606 and the amplitude scaling circuits 610 and 611. The filter/phase compensation circuits 605 and 606 and the amplitude scaling circuits 610 and 611 may comprise linear networks and active components of the power and impedance circuit 430. The AFE 675 may need not to be limited to linear networks or active elements 678, and may comprise additional components to perform the compensation and scaling described below. Similarly, the sensed current input $I_{sense}$ may be coupled to the current filter/phase compensation circuit 605, an output of which may be coupled to the current amplitude scaling circuit 611.

The conditioning and corrections provided by the AFE 675 and the associated components may improve the accuracy and the precision of the subsequent power measurement system. As will be discussed below, the components of the AFE 675 may be calibrated so that their functions and accuracy may be verified and corrected as necessary.

The AFE 675 is a system that may provide compensated and scaled sensed voltage and current signals to the zero-crossing and phase detection circuit 676. The voltage sensor 432 and current sensor 434 of the AFE 675 may be configured to sense the voltage and current, respectively, at a point in the transmitter 400 (see discussion of FIG. 4 above). The linear networks and active elements 678 may be configured to ensure that the sensed voltage and the sensed current input are properly scaled and compensated so that any performed calculations based on the sensed voltage and the sensed current are accurate. As discussed above, the voltage filter/phase compensation circuit 605, the current filter/phase compensation circuit 606, the voltage amplitude scaling circuit 610, and the current amplitude scaling circuit 611 represent the linear networks and active elements 678.

The voltage filter/phase compensation circuit 605 may receive the $V_{sense}$ input signal and may filter the signal and provide any needed phase compensation, providing an output that may be fed to an input of the voltage amplitude scaling circuit 610. Similarly, the current filter/phase compensation circuit 606 may receive the $I_{sense}$ input signal and may filter the signal and provide phase compensation to the phase of the current input $I_{sense}$, providing an output that may be fed to an input of the current amplitude scaling circuit 611. The phase compensation as provided by the voltage and current filter/phase compensation circuits 605 and 606 may be utilized to ensure that the phases of the voltage signal $V_{sense}$ and the current signal $I_{sense}$ are not influenced or affected by the sensing circuits 432 and 434, respectively, and that relative phase shifts between the two signals are not influenced or otherwise affected by any upstream components.

The voltage amplitude scaling circuit 610 may receive the filtered and compensated voltage signal output from the voltage filter/phase compensation circuit 605 and may be configured to scale the amplitude of the voltage signal. Similarly, the current amplitude scaling circuit 611 may receive the filtered and compensated current signal output from the current filter/phase compensation circuit 606 and may be configured to scale the amplitude of the current signal. The scaling of one or both of the voltage and current signals may be performed as necessary to ensure that the voltage and current signals have nearly similar amplitudes with each other, which may be useful in ensuring that the downstream zero-crossing detectors 615 and 616 are functioning properly and may be useful in avoiding errors that may be associated with unmatched amplitudes (for example, improper zero-crossing detections). An output from each of the voltage amplitude scaling circuit 610 and the current amplitude scaling circuit 611 may be fed to an input of the voltage zero-crossing detector 615 and an input of the current zero-crossing detector 616, respectively. In some embodiments, the voltage and current amplitude scaling circuits 610 and 611 may be configured to limit the amplitudes to be within 10% of each other. In some embodiments, the voltage and current amplitude scaling circuits 610 and 611 may be configured to limit the amplitudes to be within any range of each other, as established by the power and impedance measurement circuit 430 or a user, etc.

Additionally, the output of the voltage filter/phase compensation circuit 605 may be coupled to the voltage peak detector 655, an output of which, $V_{peak}$, may be coupled as an input to the analog/digital (A/D) converter 640. The output of the voltage amplitude scaling circuit 610 may be coupled to the voltage zero-crossing detector 615 as an input. Additionally, the output of the current filter/phase compensation circuit 606 may be coupled to the current peak detector 656, an output of which, $I_{peak}$, may be coupled as an input to the A/D converter 640. The output of the current amplitude scaling circuit 611 may be coupled to the current zero-crossing detector 616 as an input.

Outputs of the zero-crossing detectors 615 and 616 may be coupled to the XOR gate 620, the output of the voltage zero-crossing detector 615 comprising one input of the XOR gate 620 and the output of the current zero-crossing detector 616 comprising another input to the XOR gate 620. The zero-crossing detectors 615 and 616 may also be coupled to the sequence controller 650. The output of the XOR gate 620 may be coupled to a sample/hold switch 625 as an input.

The phase detection circuit 676 comprises the voltage zero-crossing detector 615, operably connected to the voltage amplitude scaling circuit 610, the current zero-crossing detector 616, operably connected to the current amplitude scaling circuit 611, and the XOR gate 620 that may be used to detect the phase offset between the voltage and current signals $V_{sense}$ and $I_{sense}$ operably connected to the zero-crossing detectors 615 and 616.

The voltage zero-crossing detector 615 may be configured to detect a zero crossing of a sinusoidal wave of the voltage signal output by the voltage filter/phase compensation and amplitude scaling circuits 605 and 610, respectively. The voltage zero-crossing detector 615 may be configured to generate an output signal indicating when the voltage signal crosses zero. The current zero-crossing detector 616 may be configured to detect a zero-crossing of a sinusoidal wave of the current signal output by the current filter/phase compensation and amplitude scaling circuits 606 and 611, respectively. The current zero-crossing detector 616 may be configured to generate an output signal indicating when the current signal crosses zero. The use of zero-crossing detectors 615 and 616 may reduce offset errors. In some embodiments, high speed comparators may implement the zero-crossing detectors 615 and 616. As will be discussed in further detail below, an amount of time between the zero crossings of the voltage signal and the current signal may represent or indicate a phase offset between the voltage signal and the current signal. As described below, the power and impedance at the transmit antenna 614 may be measured based on the current, the voltage, and the phase offset between the current and the voltage.

The XOR gate 620 may be configured to receive the output signals generated by the voltage and current zero-crossing detectors 615 and 616, respectively. The XOR gate 620 may receive the two inputs and may be configured to generate an output when either, but not both, of the inputs, indicating the voltage and current zero-crossings, are high (i.e., "1"). For example, when the voltage zero-crossing signal has a value of "1" and the current zero-crossing signal has a value of "0," the XOR gate 620 will generate an output of "1." However, if both the voltage zero-crossing signal and the current zero-crossing signal have a value of either "0" or "1," then the XOR gate 620 will generate an output of "0." Thus, for each cycle, the XOR gate 620 may generate two outputs (i.e., the XOR gate 620 may generate an output when one of the voltage/current signals cross zero as the AC signal is positive and again as the voltage/current signals cross zero as the AC signal goes negative). The XOR gate 620 may be replaced with other combinations of logic gates, other logic circuitry, or other phase detector implementations. The XOR gate 620, by its output when one of the zero-crossing signals is a value of "1," may provide phase detection between the voltage and current signals. Accordingly, the XOR gate 620 may detect the phase offset between the voltage and current signals and output a signal indicative or representative of that phase offset.

Some embodiments described herein may detect the magnitude of the phase offset between the voltage and current signals. Additional circuitry not described herein may be implemented to distinguish between inductive and capacitive phase shifts as necessary, for example, if the load impedance range includes both capacitive and inductive loads.

The sample/hold switch 625 may be coupled to the sequence controller 650 receiving a control signal from the sequence controller 650 (i.e., a signal provided by the sequence controller 650 may control whether the sample/hold switch 625 is in an open state or a closed state). The output of the sample/hold switch 625 may be coupled to a switch 626 as a control signal for the switch 626 (i.e., the generated output of the sample/hold switch 625 may control whether the switch 626 is in an open or closed state). The sample/hold switch 625 may be controlled by the sequence controller 650, which may also control the zero-crossing detector(s) 615 and 616 and control the discharge switch 627 and the calibration switches 628, as will be discussed below. When the switch 626 is activated (i.e., in the closed state), the dynamically variable current source 630 may be coupled to the capacitor 635 and may be configured to generate a variable current. The capacitor 635 may have a capacitance equal to $C_{ph}$. In some embodiments, the capacitor 635 may have a working voltage (i.e., a voltage capacity or rating) that may define the highest voltage that may be applied across the capacitor 635 without risk of degrading the capacitor 635. The discharge switch 627 may be configured to reset or discharge the capacitor 635, for example, when the discharge switch 627 is in a closed state, the two sides of the capacitor 635 are short circuited and thus the capacitor 635 is discharged. As discussed above, the discharge switch 627 may be coupled to the sequence controller 650, receiving a control signal from the sequence controller 650 (i.e., a signal provided by the sequence controller 650 may control whether the discharge switch 627 is in an open state or a closed state).

The A/D converter 640 may be coupled to the capacitor 635 such that a phase sense voltage ($V_{ph}$) of the capacitor 635 is fed into the A/D converter 640. Additionally, as described above, the A/D converter 640 may be coupled to the voltage peak detector 655 and the current peak detector 656 receiving their respective outputs as inputs to the A/D converter 640. The output of the A/D converter 640 may be coupled to a processor (not shown in this figure) configured to perform the power and impedance computation ("PIC") circuit 645. In some embodiments, the A/D converter 640 may be integrated into the controller 415 of the transmitter 400. In some embodiments, the A/D converter 640 may be a stand-alone processors/conversion circuit (not shown). In some embodiments, the A/D converter 640 may be integrated into the PIC circuit 645 a power and impedance algorithm. In some embodiments, the PIC circuit 645 may comprise a dedicated processor for the power and impedance measurement circuit 430. In some embodiments, the PIC circuit 645 may comprise the controller 415 of the transmitter 400 as referenced in FIG. 4. In some embodiments, the PIC circuit 645 may comprise other circuitry and processing equipment. The PIC circuit 645 may be coupled to the dynamically variable current source 630, such that a signal from the PIC circuit 645 may control the dynamically variable current source 630. For example, the PIC circuit 645 may control the dynamically variable current source 630 to output a higher or a lower reference current based on the signal from the PIC circuit 645. Additionally, as discussed briefly in relation to FIG. 4, the PIC circuit 645 may be coupled to controller 415 or any other component as referenced in FIG. 4 and communicate any of the determined information to the controller 415 so the controller may alter the signals being generated by the transmitter 400. The processor performing PIC circuit 645 may be coupled (not shown in this figure) to at least one of the controller 415, oscillator 412, driver circuit 414, and filter 416 referenced in FIG. 4.

The sequence controller 650 discussed above may also be coupled to the calibration switch 628 as a control signal (i.e., a signal from the sequence controller 650 may control whether the calibration switch 628 is in an open state or a closed state). The calibration switch 628 may couple a reference waveform generator 660 to each of the $V_{sense}$ and $I_{sense}$ input signals coupled to the inputs of the voltage filter/phase compensation circuit 605 and current filter/phase compensation circuit 606. A phase delay circuit 665 may also be coupled to the reference waveform generator 660 and at least one of the $V_{sense}$ or $I_{sense}$ input signals such that a generated reference waveform by the reference waveform generator 660 may be fed into the $V_{sense}$ or $I_{sense}$ inputs with a known phase delay.

Additionally (as described above), the filtered and phase compensated voltage and current outputs may be input into the respective peak detectors 655 and 656. The voltage peak detector 655 may be configured to determine a peak value for the coupled voltage signal. Similarly, the current peak detector 656 may be configured to determine a peak value for the coupled current signal. The outputs of the peak detectors 655 and 656 may represent analog signals proportional to a size of the peak values of the respective AC voltage and current input signals. These outputs may be provided to the A/D converter 640. The voltage and current peak detectors 655 and 656, respectively, may be configured to continuously monitor the voltage and current input signals, respectively, and continuously provide outputs to the A/D converter 640.

The power and impedance measurement system 677 may comprise the output of the XOR gate 620 coupled to the input of sample/hold switch 625. The sample/hold switch 625 may be configured to activate (i.e., enter a closed state) in response to a signal from the sequence controller 650. When activated, the sample/hold switch 625 may be configured to couple the output of the XOR gate 620 to the control input of the switch 626, such that the output of the XOR gate 620 acts as the control signal to the switch 626. Accordingly, the switch 626 may be configured to activate (i.e., enter a closed state) in response to the output of the XOR gate 620, the output representing the phase offset between the voltage and current signals. Thus, the switch 626 may be configured to couple the dynamically variable current source 630 to the capacitor 635 for the duration of the phase offset between the voltage and current signals. The capacitor 635 may be configured to integrate the current $I_{ref}$ received from the dynamically variable current source 630 through the switch 626 over a period of time proportional to the phase offset between the voltage and current signals (i.e., the output of the XOR gate 620). In some embodiments, the application of the power and impedance measurement system 677 may determine the size of the capacitor 635. The size of the capacitor 635 may be related, at least in part, to the frequency and/or the phase of the measured current and voltage signals. The A/D converter 640 may measure or sample the phase sense voltage. The phase sense voltage ($V_{ph}$) may represent the voltage across the capacitor 635 (or the voltage equal to the result of the integration performed by the capacitor 635). The A/D converter 640 may then measure (sample) the peak voltage $V_{peak}$ and peak current $I_{peak}$. The three sensed or measured values $V_{ph}$, $V_{peak}$, and $I_{peak}$ may be used to calculate a phase difference between the voltage and current signals using the equation:

$$\text{Phase Difference} = (2*\pi*\text{Frequency})*V_{ph}*C_{ph}/I_{ref} \qquad \text{Equation 1}$$

Equation 1 comprises the frequency of the measured voltage and current signal (e.g., 6.78 MHz for a wireless power system), the phase sense voltage $V_{ph}$ corresponding to the voltage across the capacitor 635 after receiving the input current $I_{ref}$ for a duration of time corresponding to a phase offset between the sensed voltage $V_{sense}$ and a sensed current $I_{sense}$. The dynamically scaled (variable) current $I_{ref}$ may represent the current fed into the capacitor 635, while $C_{ph}$ may represent the capacitance of the capacitor 635. The PIC circuit 645 may calculate a power transmitted using the same measured information. The PIC circuit 645 may use Equation 2 below to calculate the amount of power transmitted by the transmitter 400. Additionally, Equation 1 depicts the calculation that may be used to determine the phase difference over a single pulse. However, Equation 1 may be modified for use with a full cycle of the voltage and current signals that may include two pulses per cycle (see FIG. 10 for an explanation on the two pulses per cycle). Equation 1 may be modified by dividing the phase difference calculation by 2 to account for the two pulses that may exist for the full cycle of the voltage and current signals. Thus, Equation 1 may be modified as follows: Phase Difference= $(2*\pi*\text{Frequency})*V_{ph}*C_{ph}/2*I_{ref}$. Equation 1 may be further modified to account for determining the phase difference over multiple cycles. Equation 1 may be further modified as follows: Phase Difference=$(2*\pi*\text{Frequency})*V_{ph}*C_{ph}/2*(\text{Number of Cycles})*I_{ref}$.

Equation 2 may provide for the determination of the power based on the determined phase difference.

$$\text{Power} = (V_p/\sqrt{2})*(I_p/\sqrt{2})*\cos[\Phi] \qquad \text{Equation 2}$$

In Equation 2, the variable $V_p$ may represent the peak voltage and determined by the voltage peak detector 655, while the variable $I_p$ may represent the peak current as determined by the current peak detector 656. The variable $\Phi$ may represent the phase difference determined using Equation 1. The PIC circuit 645 may also be configured to calculate an impedance observed by the transmitter 400 with the information acquired as described above. Equation 3 below may be used by the PIC circuit 645 to calculate the impedance as seen by the transmit antenna 404 of the transmitter 400.

$$\text{Impedance} = V/(\text{Complex}(I)) \qquad \text{Equation 3}$$

In Equation 3, the V is the voltage and the I is the current.

The dynamically variable current source 630, as described above, may be configured to provide the current to the capacitor 635 through switch 626. The dynamically scalable feature of the dynamically variable current source 630 may provide for the ability to fine-tune or more accurately and precisely determine phase difference. As the current from the dynamically variable current source 630 is integrated over a period of time proportional to the phase offset between the voltage and current signals, the phase sense voltage $V_{ph}$ is generated in the capacitor (i.e., the voltage across the capacitor is based on the current input from the dynamically variable current source 630 over the phase offset time). The ability to dynamically adjust the output of the dynamically variable current source 630 may provide for better control of the amount of voltage allowed to accumulate in the capacitor 635, where the relationship of the voltage in the capacitor 635 $V_{ph}$ to a maximum voltage of the capacitor 635, may adversely impact the accuracy or the reliability of the phase difference calculation based on the $V_{ph}$.

For example, if the voltage in the capacitor 635 is low (i.e., less than 5% of a maximum voltage of the capacitor 635) or high (i.e., greater than 95% of the maximum voltage of the capacitor 635), the output current of the dynamically variable current source 630 may be adjusted such that the voltage accumulating in the capacitor 635 is more "centered" within the range of capacitor 635, where it may be more reliably and accurately measured. Accordingly, in Equation 1 above, if the $V_{ph}$ is lower than a threshold given a known value of the maximum voltage for the capacitor, then the current $I_{ref}$ from the dynamically variable current source 630 may be increased for a small phase difference. Alternatively, if the $V_{ph}$ is higher than a threshold given a known value of the maximum charge of the capacitor 635, then the current $I_{ref}$ from the dynamically variable current source 630 may be reduced for a large phase difference. In some embodiments, the determination of the dynamic reference current may be tied to the previous phase measurement itself. For example, a coarse measurement (including saturation conditions min/max $V_{ph}$) may be obtained using a default reference current, and then the reference current $I_{ref}$ may be adjusted to obtain a fine estimate. For example, if the actual phase between the voltage and current signals was 45 degrees, the initial coarse estimate using the default $I_{ref}$ may calculate a phase difference of 40-50 degrees and then $I_{ref}$ may be adjusted to an appropriate value which will narrow the determined phase difference down closer to 45 degrees. Various other calculation methods may be applied to determine the phase difference using a dynamically scalable current source. The determination of the ideal $I_{ref}$ from the dynamically variable current source 630 may be an iterative process. The $I_{ref}$ from the dynamically variable current source 630 may be adjusted many time until the most reliable and accurate phase sense voltage $V_{ph}$ is identified.

The reference current $I_{ref}$ from the dynamically variable current source 630 may be adjusted (or dynamically scaled) to improve the precision of the phase sense voltage measurement and resulting phase difference calculation by using a multi-step approach. The initial phase measurement may be determined using a predetermined initial reference current $I_{ref}$. This initial measurement may be a "coarse measurement." Based on the phase sense voltage, the reference current $I_{ref}$ may be dynamically scaled to improve the precision, accuracy, and reliability of the phase measurement, thus generating a "fine measurement."

The sequence controller 650 may be configured to control the number of cycles over which the phase difference may be performed. For example, when the phase difference is to be determined over a single cycle, the sequence controller 650 may be configured the control the zero-crossing detectors 615 and 616 to generate outputs for a phase offset signal comprising a "single phase cycle" pulse that may comprise two pulses per cycle (i.e., a pulse or signal indicating each time the voltage and current signals cross zero, which, as described above, occurs two per single phase cycle) or a single phase cycle between the voltage and current signals from the voltage zero-crossing detector 615 and the current zero-crossing detector 616, respectively, and then the power and impedance measurement system 677 may calculate the phase difference based on the single "phase cycle" pulse. Alternatively, when the phase difference is to be determined over multiple cycles, the sequence controller 650 may be configured to control the zero-crossing detectors 615 and 616 to generate outputs corresponding to a phase offset signal representing "multiple phase offset pulses" (i.e., a signal indicating multiple phase offsets, wherein each cycle of the multiple phase cycles comprises two pulses, such that the total number of pulses is the number of cycles*2) or a plurality a phase cycles between the voltage and current signals from the voltage zero-crossing detector 615 and the current zero-crossing detector 616, respectively. A single phase cycle may comprise a single sine wave cycle. Please see FIG. 10 below for a more detailed discussion and explanation of the number of pulses per cycle. When performing the subsequent phase difference calculation, the resulting phase difference may then be averaged over the multiple cycles. This averaging method may provide a more accurate representation of an actual phase difference between the voltage and current signals that will show less influence by potential spikes in interference or other potentially detrimental, temporary, influences in the voltage or current signals themselves or presenting in the circuitry or from environmental or computational factors. In some embodiments, the phase measurement may be performed over multiple cycles or over a period of time over which all phase offsets are to be averaged (i.e., the number of phase offsets that are detected over a 10 ms period).

Additionally, the sequence controller 650 may be responsible for resetting/discharging the capacitor 635, which may be performed before each phase measurement. As discussed above, sequence controller 650 may be coupled to the discharge switch 627 as a control signal. Accordingly, the sequence controller 650 may be configured to output a signal to the discharge switch 627, and the discharge switch 627 may be configured to enter a closed state in response to the signal from the sequence controller 650. When the discharge switch 627 is in the closed state, the two conductors of the capacitor 635 may be coupled together, thus shorting the capacitor 635 and discharging it (i.e., removing all charge from the capacitor 635). Once the capacitor 635 is discharged, the sequence controller 650 may be configured to remove the output signal to the discharge switch 627, and the discharge switch 627 may enter the opened state and the capacitor 635 will remain in its discharge state until current is again applied to it. Discharging the capacitor 635 may function as a reset of the power and impedance measurement system 677 in that the phase sense voltage $V_{ph}$ is cleared and the capacitor 635 and associated power and impedance measurement system components are ready to measure and calculate another phase difference.

In some embodiments, the PIC circuit 645 and the sequence controller 650 may be separate from the power and impedance measurement circuit 430. In some embodiments, the dynamically variable current source 630 may receive a signal from the PIC circuit 645, the signal indicating a request to increase or decrease the current based on a voltage of the capacitor 635. In some embodiments, the dynamically variable current source 630 may be separate from the power and impedance measurement circuit 430, and instead be a current input received by the power and impedance measurement circuit 430 to feed the capacitor 635.

The PIC circuit 645 and the sequence controller 650 may also provide for control over the calibration procedure, which may be performed at any time. Calibration may comprise generating a reference waveform via reference waveform generator 660 and feeding that waveform into the $V_{sense}$ and $I_{sense}$ inputs with a known phase delay. The AFE 675, the zero-crossing and phase detection circuit 676, and the power and impedance measurement system 677 may perform the functions described above to generate a determined phase difference between the voltage and current signals. Since the calibration process involves feeding a reference waveform into the $V_{sense}$ and $I_{sense}$ inputs, the measured and determined phase difference may be compared with a known (or expected) phase difference that may be determined based on the reference waveform and the known phase delay. Based on the comparison of the measured and determined phase difference and the expected phase difference, a calibration routine may characterize and compensate for any determined phase measurement error between the voltage and current signals by introducing various calculation parameters into the PIC circuit 645 or by adjusting the individual components responsible for the phase measurement error.

The PIC circuit 645 may also provide for offline harmonic correction. For example, the total output power of the transmitter 400, may be a sum of the powers of various frequency harmonics. The voltage filter/phase compensation circuit 605 and a current filter/phase compensation circuit 606 may be configured to filter out the fundamental components of voltage and current in measuring the phase difference between the voltage and current signals and the peak amplitudes of the voltage and current signals. Accordingly, since the "other" harmonics are filtered out, the power content of these other harmonics is lost. For example, if the zero-crossing method measures power at the fundamental frequency, the power at the remaining other harmonic frequencies is ignored as they are filtered out and the determined transmitted power is never equal to the total power because of the power lost at the other harmonic frequencies. The method described above may measure the power at any single frequency if a tunable filter is used.

In wireless power systems, harmonic power content (power at a harmonic frequencies may be a function of at least one of load impedance, load current, load power, power amplifier supply voltage, etc., where other correlating factors may be dependent upon the system. During system design, the entire load impedance range and output power levels may be pre-determined. The power harmonics as a function of the correlating factors described above (e.g., load impedance, load current, load power, power amplifier supply voltage, etc.) may be measured and stored in the PIC circuit 645. Accordingly, the power measurement performed above (i.e., Equation 2) may be corrected for power "lost" at other harmonic frequencies by adding to the measured fundamental power the harmonic powers based on the values stored in the PIC circuit 645.

Figure 7:
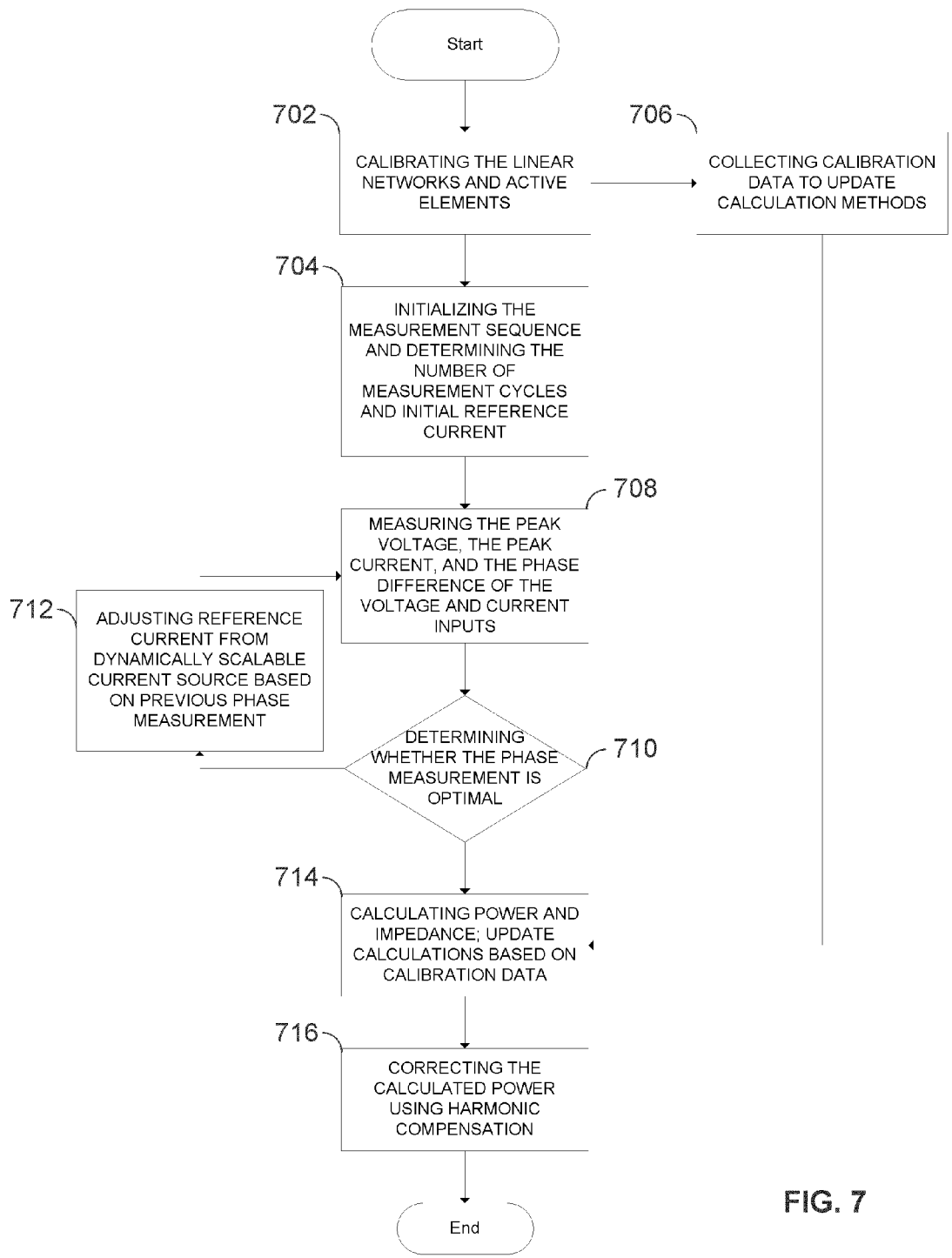
FIG. 7 is a flow chart of a method for measuring high frequency AC power and load impedance in wireless power systems.

FIG. 7 is a flow chart of a method for measuring high frequency AC power and load impedance in wireless power systems, referred to as process 700. Process 700 may be performed, in some aspects, by transmitter 400 and/or power and impedance measurement circuit 430. In some embodiments, the process 700 may be performed by receiver 500. Process 700 comprises functions performed for measuring and calculating an AC power and load impedance.

At block 702, a calibration process may be performed to ensure the various components and elements of the power and impedance measurement circuit 430 are functioning properly. If all phase compensation and amplitude scaling components are determined to be functioning properly, the process moves to block 704. If the calibration process determines that any of the components are no longer calibrated, then process moves to block 706, where the calibration data may be determined and collected before being and communicated to the calculation elements and calculation block 714 below.

At block 704, the measurement initialization process begins, including determining the number of measurement cycles to run and determining how many cycles over which the phase difference is to be measured and determined. In some embodiments, the initialization block 704 may comprise resetting the capacitor 635 and preparing for the phase measurement process. Once the initialization process is complete, the process 700 proceeds to block 708. Resetting the capacitor 635 may be controlled by the sequence controller 650, which may control discharge switch 627 to reset the capacitor 635 upon command.

At block 708, the current reference is adjusted. For the initial measurement, the current reference $I_{ref}$ from the dynamically variable current source 630 may be set at a preset value that is constant for all initial phase measurements. For subsequent phase measurements, the $I_{ref}$ current reference may be adjusted as discussed above. The PIC circuit 645 may determine to adjust the $I_{ref}$ current reference and the amount to adjust it. For example, if the phase difference is determined to be small, then the current reference $I_{ref}$ is increased. When the phase difference is determined to be large, then the reference current $I_{ref}$ is decreased. After the desired reference current $I_{ref}$ is identified, the process 700 proceeds to block 710. In some embodiments, alternative algorithms or determinative methods may be used to identify the reference current $I_{ref}$ producing the most precise, accurate, and reliable phase difference measurement and calculation.

At block 710, the peak voltage and the peak current are measured by the voltage peak detector 655 and the current peak detector 656, and the phase using the phase detection circuit 676. Then the process 700 proceeds to block 712. At block 712, the AC power and load impedance computation circuit 645 determines if the phase measurement from block 710 is optimal. If the phase measurement is determined to be optimal, then the process 700 progresses to block 714. If the phase measurement is not optimal, then the process 700 returns to block 708 to adjust the reference current and to repeat the measurements and determination of optimal measurements. The PIC circuit 645 may make the determination.

At block 714, power and impedance are determined using the information determined and measured at block 710. If the initial calibration step identified that there was a phase measurement error, then compensating parameters determined and characterized by the calibration process may be factored into the power and impedance calculations at block 714. These calculations may be performed by the processor or other circuitry configured to process the PIC circuit 645 (e.g., controller 415 of FIG. 4). After the power and impedance have been determined and appropriately compensated with the calibration data, the process 700 proceeds to block 716, where the power measurement is corrected via harmonic compensations.

Figure 8:
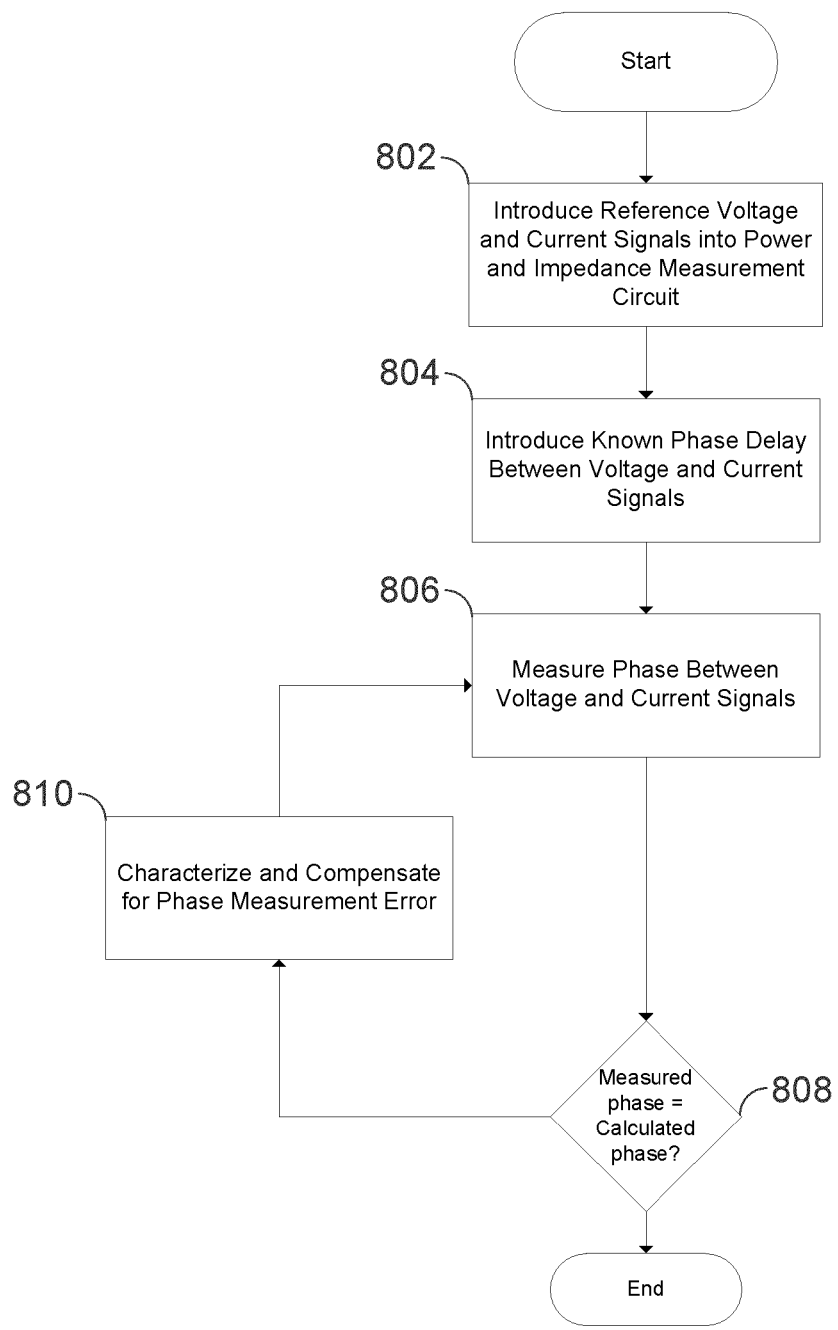
FIG. 8 is a flow chart of a method for calibrating an apparatus for measuring high frequency AC power and load impedance.

FIG. 8 is a flow chart of a method for calibrating an apparatus for measuring high frequency AC power and load impedance. Method 800 may be performed, in some aspects, by transmitter 400 and/or power and impedance measurement circuit 430. In some embodiments, the method 800 may be performed by the sequence controller 650. Method 800 comprises functions performed for calibrating an AC power and load impedance circuit or circuits.

At block 802, the method 800 may begin by introducing a reference voltage and/or a reference current signal into the power and impedance measurement circuit 430. The reference signals may be introduced by sequence controller 650 and may be sourced from a reference waveform source 660. The sequence controller 650 may activate calibration switch 628 when the sequence controller 650 determines the power and impedance measurement circuit 430 should be calibrated. At block 804, the reference waveforms (voltage and current) will have a known phase delay introduced between them by the phase delay circuit 665.

At block 806, the phase between the voltage and current reference signals may be measuring using the components of the power and impedance measurement circuit 430 as described above. At block 808, the method may determine if the measured phase is equal to the calculated phase based on the known reference signals and the known phase delay. If the measured phase matches the calculated phase, then the method ends. If the measured phase does not match the calculated phase, then the method 800 proceeds to block 810. At block 810, the error in the measured phase is characterized and the appropriate component of the power and impedance measurement circuit 430 is compensated to account for the measured phase error. In some embodiments, block 810 may compensate any one of the AFE 675 components. In some embodiments, block 810 may be configured to compensate for errors introduced by a component of a zero-crossing and phase detection circuit 676, and a power and impedance measurement system 677. After a compensation is performed by block 810, the method 800 repeats the phase measurement given the known reference signals and known phase delay at block 806 before checking to see if the measured phase matches the calculated phase at block 808. If the phases match, then the method 800 ends. If not, then method 800 repeats blocks 810, 806, and 808 until the phases do match.

Figure 9:
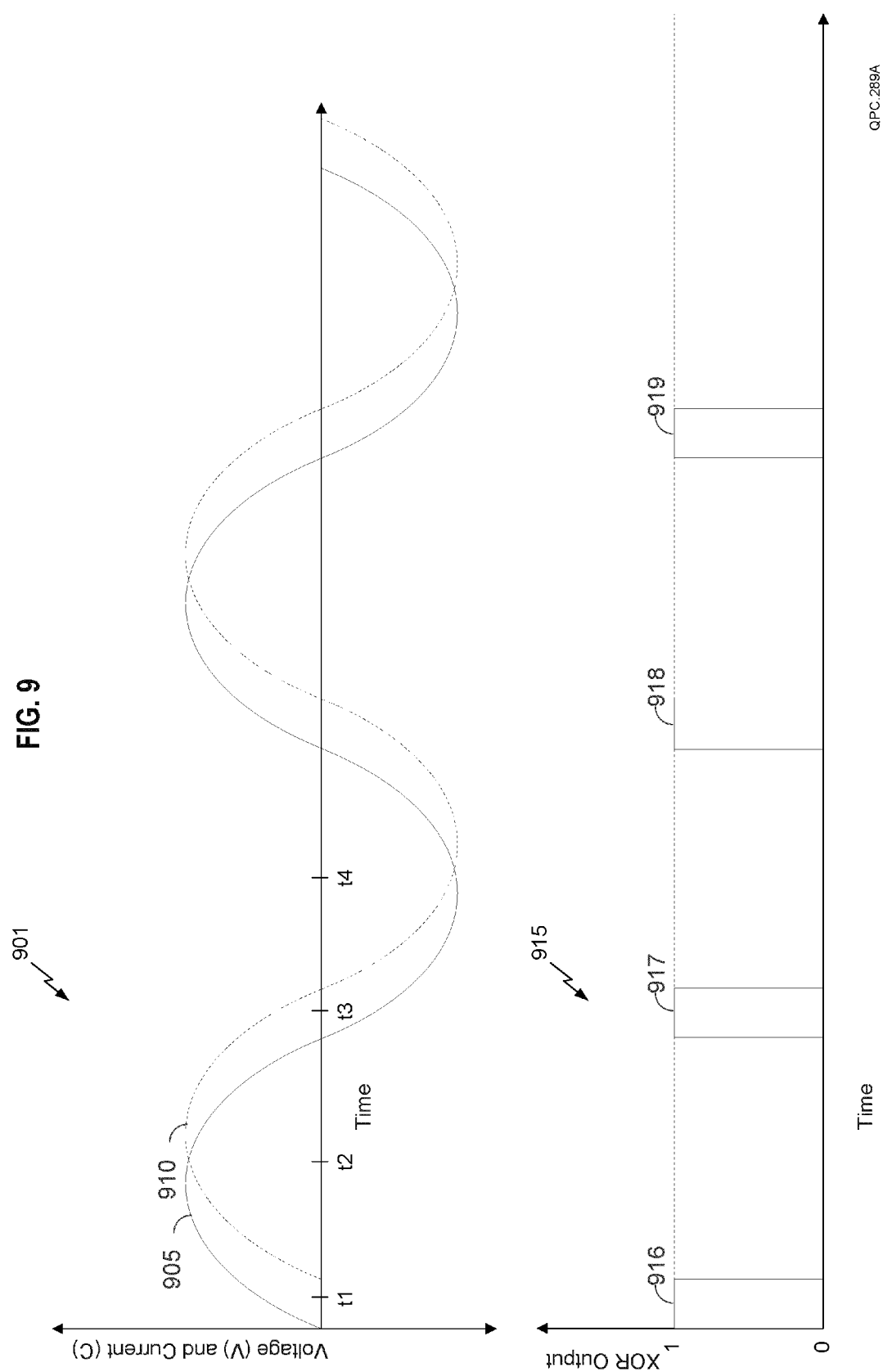
FIG. 9 shows a first plot diagram of voltage and current versus time and a second plot diagram of the output of the Exclusive OR (XOR) gate versus time.

FIG. 9 shows a first plot diagram of voltage and current versus time and a second plot diagram of the output of the XOR gate 620 versus time. The time shown on the first plot diagram and the second plot diagram are intended to be the same.

The first plot diagram represents graph 901. On the graph 901, the x-axis of the graph 901 represents time and the y-axis represents the amplitude of the two signals 905 and 910. The graph 901 shows two sinusoidal cycles of two signals 905 and 910. The signal 905 corresponds to the sensed current signal and the signal 910 corresponds to the sensed voltage signal, as described above in reference to FIG. 6.

The second plot diagram represents graph 915. On the graph 915, the x-axis of the graph 915 represents time and the y-axis represents the output of the XOR gate 620 described above in relation to FIG. 6. As shown by graph 915, the XOR gate 620 may have one of two possible outputs: 0 or 1.

The two graphs 901 and 915 show the output of the XOR gate 620 on graph 915 in relation to the activity of the sensed current and voltage signals shown on graph 901 at corresponding times. For example, as the current signal 905 passes zero and as the voltage signal 910 is still negative (i.e., at t1), the XOR gate 620 generates an output of "1." The XOR gate 620 generates an output of "1" because one of the two inputs may be "on" (at t1, the input from the current zero-crossing detector 616 is "on" because current signal 905 is positive and input from the voltage zero-crossing detector 615 is "off" because voltage signal 910 is "off"). Similarly, the XOR gate 620 may generate an output when the current signal 905 is negative and voltage signal 910 is positive (i.e., at t3). When both the current signal 905 and the voltage signal 910 are positive (above zero), then the XOR gate 620 may not generate an output when both of the inputs may be "on." Thus, pulse 916 indicates the first pulse of a first cycle, while pulse 917 shows a second pulse of the first cycle. Similarly, pulse 918 indicates a first pulse of a second cycle, while pulse 919 shows a second pulse of the second cycle. Thus, a phase difference being determined over the first cycle may utilize the pulses 916 and 917 (as described above in relation to the Equation 1 related to FIG. 6). A phase difference being determined over multiple cycles (here, two cycles) may utilize all the pulses 916, 917, 918, and 919 (as described above in relation to the Equation 1 related to FIG. 6).

Figure 10:
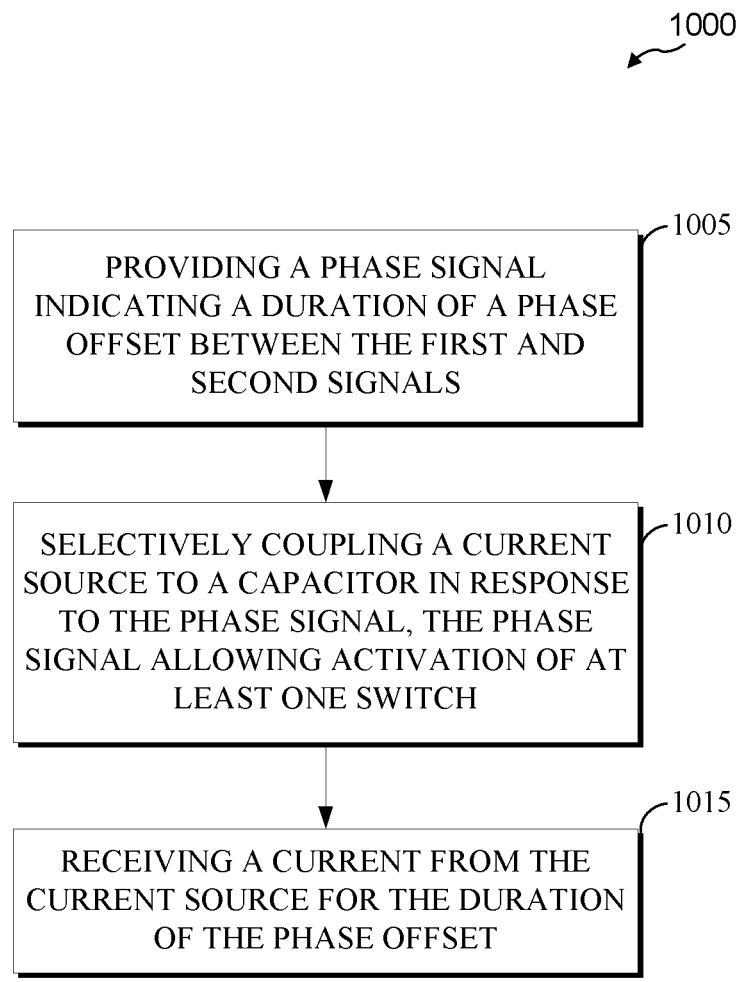
FIG. 10 is a flowchart of an exemplary method of calculating a phase difference between the sensed current signal and the sensed voltage signal.

FIG. 10 is a flowchart of an exemplary method of calculating a phase difference between the sensed current signal and the sensed voltage signal. In an embodiment, the power and impedance measurement circuit 430 of FIGS. 4 and 6 may perform the method 1000 of FIG. 10. In another embodiments, the transmitter 402 or the controller 415 of FIG. 4 may perform the method 1000.

At block 1005, the method 1000 may generate a phase signal indicating a duration of a phase offset between the first and second signals. In some embodiments, the phase signal may be provided by the analog front end (AFE) 675 and the zero-crossing and phase detection circuit 676 of the power and measurement circuit 430. In some embodiments, the phase signal may be provided by an external device separate from the power and impedance measurement circuit 430.

At block 1010, the method 1000 may selectively couple a dynamically variable current source 630 to a capacitor 635 in response to the phase signal, the phase signal allowing activation of at least one switches 625 or 626. In some embodiments, the current source may be the dynamically variable current source of the power and impedance measurement system 677. In some embodiments, the selectively coupling may be performed by the switches 625 and 626 of the power and impedance measurement system 677. In some embodiments, the current source may be an external current source not part of the power and impedance measurement circuit 430.

At block 1015, the method 1000 may receive a current from the current source for the duration of the phase offset. In some embodiments, the current from the current source may be received by the capacitor 635. In some embodiments, the current from the current source may be varied based on at least one of the size of the capacitor 635, the duration of the phase offset, and the current from the current source.

Figure 11:
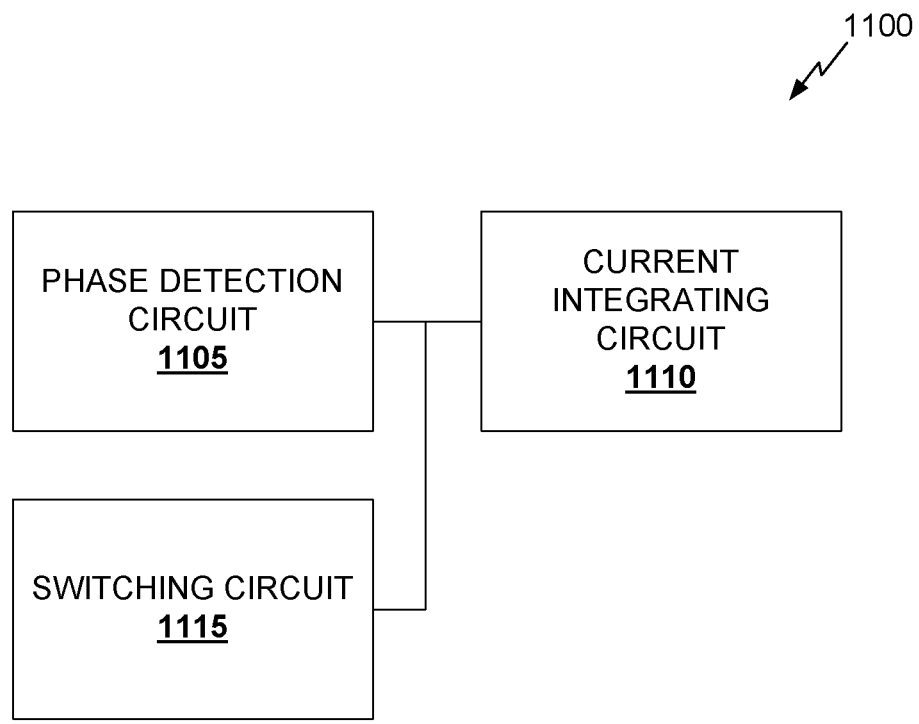
FIG. 11 is a functional block diagram of an AC power and load impedance measuring circuit.

FIG. 11 is a functional block diagram of a power and impedance measurement circuit 430 that may be employed as depicted in FIG. 6. In some embodiments, the power and impedance measurement circuit 430 may comprise more components or fewer components than the simplified measurement circuit 1100 shown in FIG. 11. The simplified measurement circuit 1100 may include only those components useful for describing some prominent features of implementations within the scope of the claims. The simplified measurement circuit 1100 may include a phase offset detection circuit 1105, a current integrating circuit 1110, and a switching circuit 1115.

In some aspects, one or more of the phase offset detection circuit 1105, the current integrating circuit 1110, and the switching circuit 1115 may be implemented within one or more of the power and impedance measurement circuit 430, the transmitter 402, and/or the controller 415.

In some implementations, the phase offset detection circuit 1105 may be configured to perform one or more of the functions described above with respect to block 1005 of method 1000. The phase offset detection circuit 1105 may include one or more of the AFE 675 and/or the zero-crossing and phase detection circuit 676. In some embodiments, the phase offset detection circuit 1105 may include the sequence controller 650 or the controller 415. In some embodiments, means for providing a phase signal indicating a duration of a phase offset between the first and second signals may include the phase offset detection circuit 1105.

In some implementations, the current integrating circuit 1110 may be configured to perform one or more of the functions described above with respect to block 1015 of method 1000. The current integrating circuit 1110 may include the capacitor 635. In some embodiments, means for receiving a current from a current source for the duration of the phase offset between the first and second signals may include current integrating circuit 1110.

In some implementations, the switching circuit 1115 may be configured to perform one or more of the functions described above with respect to block 1010 of method 1000. In some embodiments, the switching circuit 1115 may include at least one of switches 625, 626, and 637. In some embodiments, at least one means for selectively coupling the current from the current source to the means for receiving a current in response to a phase signal, the phase signal allowing activation of the at least one means for selectively coupling may include the switching circuit 1115.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions may not be interpreted as causing a departure from the scope of the embodiments of the invention.

The various illustrative blocks, modules, and circuits described in connection with the embodiments disclosed herein may be implemented or performed with a general purpose processor, a Digital Signal Processor (DSP), an Application-Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor may read information from, and write information to, the storage medium. In the alternative, the storage medium may be integral to the processor. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above may also be included within the scope of computer readable media. The processor and the storage medium may reside in an ASIC.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for determining a phase difference between a time-varying voltage and a time-varying current, comprising:
a transmit circuit comprising an antenna, the transmit circuit configured to generate a wireless field via the antenna for transferring charging power to a receiver device, the wireless field based on the time-varying voltage and the time-varying current;
a phase detection circuit configured to output a phase signal indicating a duration of a phase offset between the time-varying voltage and the time-varying current;
a capacitor configured to receive a current from a current source for the duration of the phase offset between the time-varying voltage and the time-varying current; and
at least one switch operably coupled to the capacitor and configured to selectively couple the current from the current source to the capacitor in response to the phase signal, the phase signal allowing activation of the at least one switch.

2. The apparatus of claim 1, wherein the current source comprises a dynamically variable current source, and wherein the current comprises a dynamically variable current from the dynamically variable current source based on an input signal indicating a request to increase or decrease the current based on a voltage of the capacitor compared to a working voltage of the capacitor.

3. The apparatus of claim 1, further comprising a controller configured to determine the phase difference based on a voltage across the capacitor, a capacitance of the capacitor, and the current from the current source.

4. The apparatus of claim 3, wherein the controller is further configured to determine a power of the time-varying voltage and the time-varying current based at least in part on at least one of a peak voltage of the time-varying voltage, or a peak current of the time-varying current, or the phase difference, or any combination thereof.

5. The apparatus of claim 4, wherein the controller is further configured to correct the determined power by a sum of powers of the time-varying voltage and the time-varying current at various harmonic frequencies of the time-varying voltage and the time-varying current.

6. The apparatus of claim 3, wherein the controller is further configured to control a discharge of the capacitor.

7. The apparatus of claim 1, further comprising a controller configured to determine a number of phase cycles over which the phase difference is determined, wherein increasing the number of phase cycles over which the phase difference is determined increases an accuracy of the determined phase difference.

8. The apparatus of claim 1, further comprising a voltage sensor coupled to a transmitter and configured to sense a voltage signal from the transmitter, wherein the time-varying voltage represents the voltage signal sensed by the voltage sensor.

9. The apparatus of claim 8, further comprising a phase compensation circuit configured to limit an effect of the voltage sensor on relative phase shifts between the time-varying voltage and the time-varying current.

10. The apparatus of claim 1, further comprising a current sensor coupled to a transmitter and configured to sense a current signal from the transmitter, wherein the time-varying current represents the current signal sensed by the current sensor.

11. The apparatus of claim 10, further comprising a phase compensation circuit configured to limit an effect of the current sensor on phase shifts between the time-varying voltage and the time-varying current.

12. The apparatus of claim 1, wherein the phase detection circuit is configured to determine a magnitude of the phase offset between the time-varying voltage and the time-varying current, the phase offset indicating a duration between a zero-crossing of the time-varying voltage and a zero-crossing of the time-varying current.

13. The apparatus of claim 1, further comprising a controller configured to calibrate the phase detection circuit using a reference waveform, wherein the reference waveform includes a controlled phase offset between the time-varying voltage and the time-varying current, and configured to characterize and compensate the determined phase difference for a phase measurement error between the time-varying voltage and the time-varying current.

14. The apparatus of claim 1, further comprising amplitude scaling circuits configured to limit amplitudes of the time-varying voltage and the time-varying current to be within 10% of each other.

15. A method for determining a phase difference between a first signal and a second signal, comprising:
    generating a phase signal indicating a duration of a phase offset between the first and second signals;
    selectively coupling a current source to a capacitor in response to the phase signal, the phase signal allowing activation of at least one switch; and
    receiving a current from the current source for the duration of the phase offset between the first and second signals.

16. The method of claim 15, further comprising generating a wireless field for transferring charging power to a receiver device via an antenna coupled to a transmit circuit, the wireless field based on a time-varying voltage and a time-varying current, wherein the first signal comprises the time-varying voltage and the second signal comprises the time-varying current.

17. The method of claim 15, wherein the current source comprises a dynamically variable current source, and wherein the current from the current source comprises a dynamically variable current from the dynamically variable current source based on an input signal indicating a request to increase or decrease the current based on a voltage of the capacitor compared to a voltage capacity or rating of the capacitor.

18. The method of claim 15, further comprising determining the phase difference based on a voltage across the capacitor, a capacitance of the capacitor, and the current from the current source.

19. An apparatus for determining a phase difference between a first signal and a second signal, comprising:
    means for generating a phase signal indicating a duration of a phase offset between the first and second signals;
    means for receiving a current from a current source for the duration of the phase offset between the first and second signals; and
    at least one means for selectively coupling the current from the current source to the means for receiving a current in response to a phase signal, the phase signal allowing activation of the at least one means for selectively coupling.

20. The apparatus of claim 19, further comprising a means for transmitting wireless power to a receiver device, wherein the means for transmitting comprises a means for generating a wireless field based on a time-varying voltage and a time-varying current, wherein the first signal comprises the time-varying voltage and the second signal comprises the time-varying current.

* * * * *